United States Patent [19]

Suda

[11] Patent Number: 5,229,081
[45] Date of Patent: Jul. 20, 1993

[54] APPARATUS FOR SEMICONDUCTOR PROCESS INCLUDING PHOTO-EXCITATION PROCESS

[75] Inventor: Toshikazu Suda, Yokohama, Japan

[73] Assignee: Regal Joint Co., Ltd., Kanagawa, Japan

[21] Appl. No.: 670,368

[22] Filed: Mar. 14, 1991

Related U.S. Application Data

[63] Continuation of Ser. No. 309,317, Feb. 10, 1989, abandoned.

[30] Foreign Application Priority Data

Feb. 12, 1988 [JP] Japan .................................. 63-31511

[51] Int. Cl.⁵ .......................... B01J 19/12; B05D 3/06
[52] U.S. Cl. .................................. 427/186; 422/186.3; 118/620; 118/717; 204/157.44; 204/157.62
[58] Field of Search .................. 204/157.41, 157.44, 204/157.45, 157.61, 157.64, 157.63; 422/186.186.3, 186.04; 427/53.1, 54.1, 86; 118/50.1, 719, 620, 621

[56] References Cited

U.S. PATENT DOCUMENTS

| | | | |
|---|---|---|---|
| 3,490,961 | 1/1970 | Frieser et al. | 204/157.45 |
| 4,012,301 | 3/1977 | Rich et al. | 204/157.41 |
| 4,340,617 | 7/1982 | Deutsch et al. | 204/157.41 |
| 4,371,587 | 2/1983 | Peters | 204/157.45 |
| 4,435,445 | 3/1984 | Allred et al. | 427/54.1 |
| 4,474,829 | 10/1985 | Peters | 204/157.45 |
| 4,558,017 | 12/1985 | Gupta et al. | 204/157.45 |
| 4,654,226 | 3/1987 | Jackson et al. | 427/54.1 |
| 4,695,331 | 9/1987 | Ramaprasad | 204/157.45 |
| 4,702,808 | 10/1987 | Lemelson | 204/157.41 |
| 4,753,716 | 6/1988 | Beatty et al. | 204/157.44 |
| 4,766,091 | 8/1988 | Ohtoshi et al. | 204/157.45 |

FOREIGN PATENT DOCUMENTS

| | | | |
|---|---|---|---|
| 3000802 | 7/1981 | Fed. Rep. of Germany | 204/157.45 |
| 61-28443 | 2/1986 | Japan . | |
| 962340 | 9/1982 | U.S.S.R. | 204/157.45 |

OTHER PUBLICATIONS

Delineated Cadmium Films produced by the Photolysis of Cadmium Dimethyl by M. W. Jones et al., Nature, Oct. 8, p. 177, 1966.
Epitaxial Growth with Light Irradiation by M. Kumagawa et al., Japanese Journal of Applied Physics, vol. 7, No. 11, pp. 1332-1341, 1968.
Low-Temperature Silicon Epitaxy, R. G. Freiser, Journal of Electrochemical Society, vol. 115, No. 4, pp. 401-405, 1968.
Journal of Applied Physics, Y. Kata et al., vol. 62, Nov. 1, 1987, No. 9.
Journal of Applied Physics, T. Suda et al., Mar. 15, 1992, vol. 71, No. 6.
Kamisako et al. 1984. Analysis of Deposition Rate Distribution in the Photo-CVD of a-Si by a Unified Reactor with a Lamp Japanese Journal of Applied Physics. 23(10):776-778.

(List continued on next page.)

Primary Examiner—Donald P. Walsh
Assistant Examiner—Daniel Jenkins
Attorney, Agent, or Firm—Morgan & Finnegan

[57] ABSTRACT

An apparatus for use in semiconductor fabrication that includes use of a photo-excitation process and is provided with a revolving gas chamber for forming spiral vortices flow of purge gas located at the upper or side part of a gas reaction chamber, an internal or external light source, a partition having a centrally located circular opening provided between the revolving gas chamber and the gas reaction chamber, or without the partition when the revolving gas chamber is made smaller than the gas reaction chamber. The revolving gas chamber has a multiplicity of gas inlets oriented at an angle with respect to the center of the revolving gas chamber to produce a gas flow in one direction to form spiral vortices that revolves and thereby prevents the light source or light transmitting window from becoming contaminated by process reactions.

6 Claims, 5 Drawing Sheets

OTHER PUBLICATIONS

Langford et al. 1987. Maintaining Window Transparency in Photo-CVD: A Simultaneous Etch/Deposition Method. Proc. 19th EEE Photovoltaic Conf. pp. 573, 575-576.

Ando et al. 1985. Photoenhanced metalorganic chemical vapor deposition of ZnSe films using Diethylzin & dimethylselemide. J. Appl. Phys. 58(2): 802-805.

Inoue et al. 1983. Photochemical Vapor Deposition of undoped & n-type amorphous silicon films produced from disilane. Appl. Phys. Lett. 43(8):774-775.

Zarnani et al. 1986. Optical properties of UV laser photolytic deposition of hydrogenated amorphous silicon. J. Appl. Phys. 60 (7):2523-2529.

Jasinoki et al. 1982. Excessive laser-induced deposition of silicon nitride thin films. J. Appl. Phys. 61(1):431 & 433.

Kazahaya et al. Valency Control in Photochemically-Deposited a-Si: H from $Si_2H_6$, Tech. Dig. of Int. PUSEC-1, Kobe, Japan. pp. 449-452.

Yoshikawa et al. 1984. Growth of hydrogenated amorphous silicon films by ArF Excessive Laser Photodissociation of Disilane. Jap. J. of Appl. Phys. 23(2):L91—L93.

Sugawara et al. 1979. Effects of radiation profile and internal light filtering by a product on the reaction characteristics in plate type photo reactors. Dept. of Fuel Energy, Akita University, Akita. vol. 12(2):143-147.

Saitoh et al. 1983. Optical and electrical properties of amorphous silicon films prepared by photochemical vapor deposition. Appl. Phys. Lett. 42(8); 678-679.

Rocheleau et al. 1986. Properties of a-Si:H and a-SiGe:H films deposited by photo-assisted CVD. Mat. Res. Soc. Symp. Proc. vol. 70. pp. 37-42.

Numasawa et al. 1986. Photo CVD system for silicon nitride film. Journal of Electronic Materials. 15(10:27-30.

Tadaki. 1968. Fluid dynamics reaction characteristics of fluid in viscuous flow between parallel plates. Part II. Analysis of the reaction characteristics by a photochemical reaction. Dept. of Chem. Eng. Tohaku University, Sendai, Japan. pp. 453-465.

– continued –

APPARATUS FOR SEMICONDUCTOR PROCESS INCLUDING PHOTO-EXCITATION PROCESS

This is a continuation of co-pending application Ser. No. 07/309,317, filed on Feb. 10, 1989, now abandoned.

BACKGROUND OF THE INVENTION

1. Field of the Invention

The present invention relates to an apparatus for manufacturing semiconductors used in integrated circuits, optoelectronic devices and the like.

2. Description of the Prior Art

In the prior art, the plasma process has been used for the low temperature production of semiconductors used in integrated circuits optoelectronic devices and the like. However, it has been impossible to avoid radiation damage caused by the high energy particles, such as ions and electrons, that are generated by the plasma process. This has led in recent years to the use of a photo-excitation process, a non-damage process that utilizes a photochemical reaction. The photo-excitation process is a technique whereby optical energy is used to excite a reaction gas and promote a chemical reaction for gas phase growth, etching, doping and ashing, for example. The photo-excitation process consists of a reaction chamber and a light source constituted of, for example, a lamp (for example, a mercury lamp, mercury-xenon lamp, deuterium lamp, xenon lamp, inert gas lamp or rare gas lamp) or a laser (for example, an excimer laser, argon laser, $CO_2$ Laser, dye laser YAG laser or free electron laser) and synchrotron radiation, and is configured so that light from the light source is led to the reaction chamber via appropriate optical elements, such as mirrors and lenses, to excite the reaction gas and promote a chemical reaction. The photo-excitation process can enable the reaction to proceed at a low temperature, even at room temperature. Compared with other methods there is very little radiation damage, and by selecting an appropriate wavelength the reaction can be performed with no damage.

Conventional arrangements for photo-excitation processes are shown in FIGS. 8 and 9. In FIG. 8, numeral 2 denotes a gas reaction chamber and 3 a light transmitting window provided at the top part of the gas reaction chamber 2. A light source is provided above the light transmitting window 3. A reaction gas inlet 7 is provided in the side wall of the gas reaction chamber 2. A substrate holder 8 is attached inside the gas reaction chamber 2 by an appropriate means (not shown). Numeral 9 denotes a substrate which is placed on the substrate holder 8. An exhaust outlet 10 is provided at the lower part of the gas reaction chamber 2 and is connected to a vacuum pump. A window-spray gas inlet 23 is provided in the upper side wall of the gas reaction chamber 2 with the supply opening pointing upward at an angle. In the example of the conventional configuration shown in FIG. 8, the light emitted by an external light source passes through the light transmitting window 3, which shuts off the atmosphere, and excites the reaction gas introduced via the reaction gas inlet 7 provided in the side wall of the gas reaction chamber 2, whereby a photochemical reaction takes place on the substrate 9 in the gas reaction chamber 2. However, because the reaction gas is also in contact with the lower surface of the light transmitting window 3, the reaction gas also produces a photochemical reaction on the lower surface of the light transmitting window 3.

The reaction gas which has completed the chemical reaction is evacuated to the outside by a vacuum pump via the exhaust outlet 10.

With reference to FIG. 9, a light source chamber 21 is formed in the upper part of the gas reaction chamber 2. A light source 11 is attached inside the light source chamber 21 by an appropriate means (not shown). A mirror 12 is attached by an appropriate means (not shown) between the light source 11 and the top face of the light source chamber 21. A purge gas inlet 22 is provided in the side wall of the light source chamber 21. An exhaust outlet 10 is provided in the side wall of the light source chamber 21 opposite to the side wall in which the purge gas inlet 22 is provided. Elements denoted by reference numerals 3, 7, 8, 9, 10 and 23 in the gas reaction chamber 2 at the lower part of the light source chamber 21 have the same arrangement as that shown in FIG. 8.

In the example of the conventional configuration shown in FIG. 9, direct light from the light source 11 provided in the light source chamber 21 in which gas is replaced by purge gas introduced via the purge gas inlet 22, and light reflected by the mirror 12, pass through the light transmitting window 3 and excite the reaction gas introduced via the reaction gas inlet 7 provided in the side wall of the gas reaction chamber 2 and produces a photochemical reaction on the substrate 9 in the gas reaction chamber 2. However, as in the case described above, because the reaction gas is also in contact with the lower surface of the light transmitting window 3, the reaction gas also produces a photochemical reaction on the lower surface of the light transmitting window 3.

In the case of each of the arrangements shown in FIGS. 8 and 9, a photochemical reaction is produced on the lower surface of the light transmitting window 3 that results in the contamination of the lower surface of the light transmitting window 3. As the film of contamination becomes thicker it limits the amount of light that is transmitted from the light source to the gas reaction chamber 2, thereby inhibiting the photochemical reaction in the gas reaction chamber 2. Described below are conventional methods used to prevent such a film forming on the light transmitting window 3.

1. Spraying inert gas on the light transmitting window 3 (with reference to FIGS. 8 and 9, the spraying on the light transmitting window 3 with inert gas from the gas inlet 23).

2. Coating the light transmitting window 3 with a fluoride oil.

3. Inserting a heavily perforated quartz plate or a teflon film winder under the light transmitting window 3.

However, these methods have the following problems. In the first method in which inert gas is sprayed on the light transmitting window 3, spraying a large amount of inert gas onto a light transmitting window 3 with a large area produces turbulence that makes it impossible to avoid reaction gas being drawn in, which results in the deposition of the said film on the light transmitting window 3. In the case of the second method in which the light transmitting window 3 is coated with a fluoride oil, because the fluoride oil is decomposed by the light, over long periods of use (for example 30 min.) it is not.able to prevent the deposition of the film on the light transmitting window 3. In the case of the third method which involves inserting a heavily perforated quartz plate or a teflon film winder under the light transmitting window 3, the overall amount of transmitted light is reduced and the size of the apparatus is increased.

SUMMARY OF THE INVENTION

In view of the points described above, it is therefore an object of the present invention to provide a photo-excitation process method and apparatus and a semiconductor process method and apparatus which can also be adapted for the plasma process, that is capable of continuous operation for extended periods without any deterioration in optical transmissivity and is also capable of producing a uniform photochemical reaction on the substrate.

To achieve this object, in accordance with the present invention an apparatus for a semiconductor process including a photo-excitation process is provided with a revolving gas chamber for forming spiral vortices flow of purge gas at upper or side portions of a gas reaction chamber, an internal light source or an external light source, in which either a partition having a centrally located circular opening is provided between the revolving gas chamber and the gas reaction chamber or the revolving gas chamber is made smaller than the gas reaction chamber, the side wall of the revolving gas chamber being provided with a multiplicity of gas inlets to control a gas flow by forming spiral vortices, where, all of the gas inlets are oriented to produce a gas flow in the same direction, and the side wall of the gas reaction chamber is provided with one or more reaction gas inlets.

In the apparatus for a semiconductor process including a photo-excitation process configured as described above, gas introduced into the revolving gas chamber via gas inlets moves along the inner surface of the wall of the revolving gas chamber to produce a spiral vortices. As a partition having a centrally located circular opening is provided between the revolving gas chamber and the gas reaction chamber, the spiral vortices formed in the revolving gas chamber is consolidated by the circular opening in the partition and descends into the gas reaction chamber as vortex flow. When the revolving gas chamber is smaller than the gas reaction chamber, the spiral vortices formed in the revolving gas chamber also descends into the gas reaction chamber as a vortex flow, without disturbance to the flow, that is, without reverse flow although there is no partition between the revolving gas chamber and the gas reaction chamber.

The spiral vortices can be formed away from the window or top surface of the revolving gas chamber, and the spiral vortices do not need to be in contact with the window or top surface of the revolving gas chamber. Reaction gas introduced into the gas reaction chamber via the reaction gas inlet merges with the spiral vortices to form a uniform flow giving the same effect as substrate rotation mechanism. The reaction gas is excited by light emitted by the light source and a photochemical reaction takes place on the substrate in the gas reaction chamber. Following this, the reaction gas is evacuated via an exhaust outlet to the outside by a vacuum pump.

Other objects and advantages of the invention will become apparent from the following description taken in conjunction with the accompanying drawings.

DETAILED DESCRIPTION OF THE PREFERRED EMBODIMENTS

Figure 1:
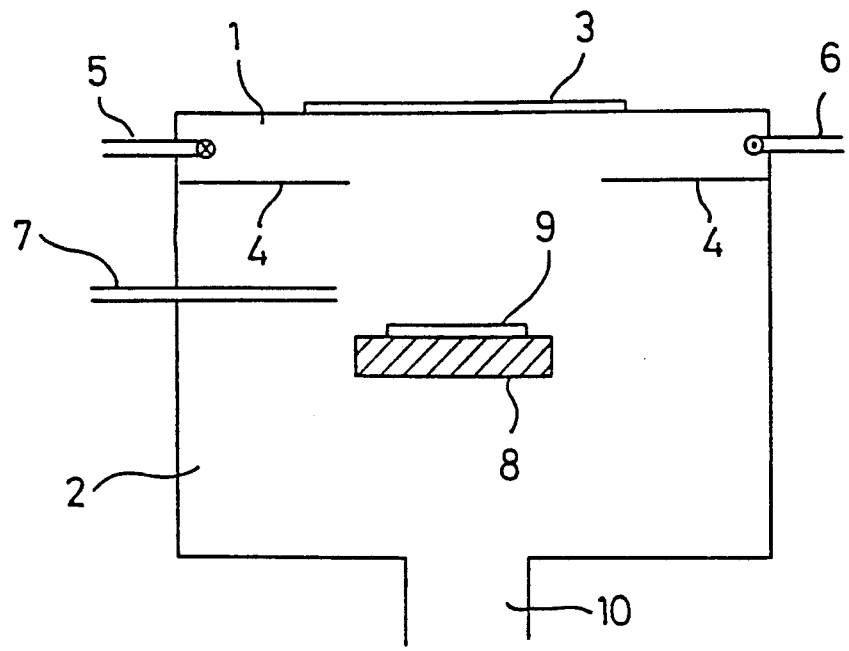
FIG. 1 is a view of a photo-excitation process apparatus with an external light source.

With reference to FIG. 1 which shows a photo-excitation process apparatus with an external light source, the upper part forms a cylindrical revolving gas chamber 1 and the lower part forms a gas reaction chamber 2, and a partition 4 having a centrally located circular opening is provided between the revolving gas chamber 1 and the gas reaction chamber 2. Although in this embodiment the revolving gas chamber is cylindrically shaped, the shape thereof is not limited to the cylindrical. A light transmitting window 3 is provided in the top part of the revolving gas chamber 1. A light source (not shown) is provided above the light transmitting window 3. Numerals 5 and 6 denote gas inlets which are provided at the periphery of the revolving gas chamber 1; in this embodiment, one gas inlet is provided at the opposite side to the other, separated by 180°. The gas inlets 5 and 6 are oriented at an angle with respect to the center of the revolving gas chamber; in this embodiment the orientation is in a direction that will produce clockwise spiral vortices. That is, with reference to the drawing, the gas inlet 5 faces toward the back surface of the drawing sheet and the gas inlet 6 faces away from the surface of the drawing sheet. Numeral 7 denotes a reaction gas inlet, which in this embodiment is provided in the side wall of the gas reaction chamber 2. A substrate holder 8 is attached inside the gas reaction chamber 2 by an appropriate means (not shown). Numeral 9 denotes a substrate which is placed on the substrate holder 8. The reaction gas inlet 7 is provided at a position that is higher than the substrate 9. Provided at the lower part of the gas reaction chamber 2 is an exhaust outlet 10 that is connected to a vacuum pump (not shown).

Figure 2:
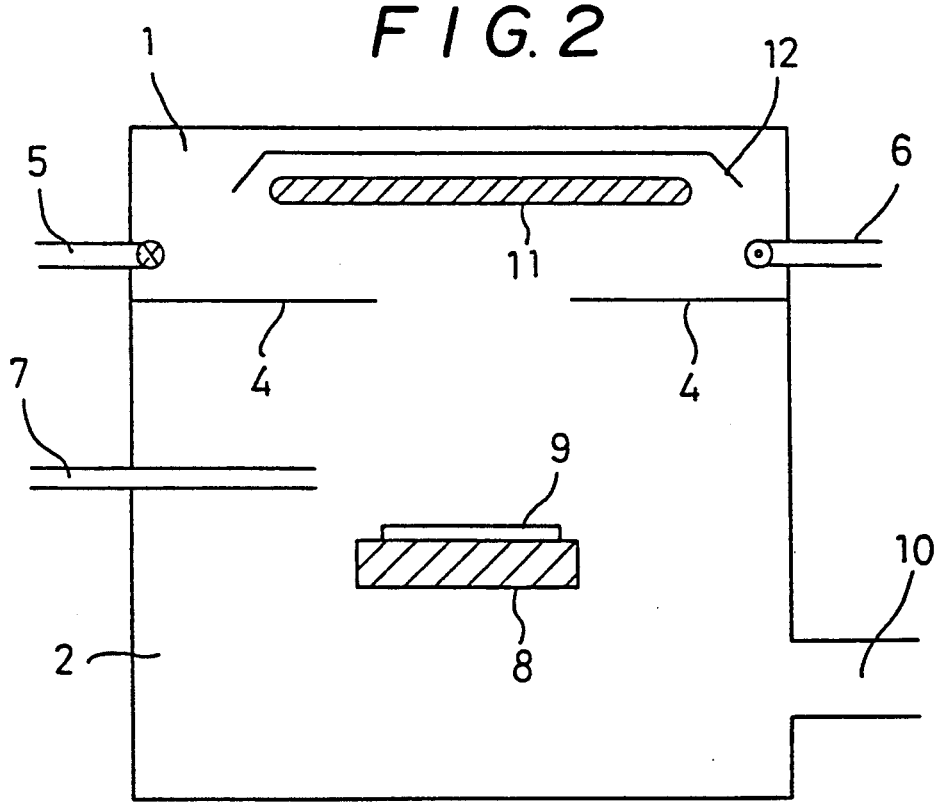
FIG. 2 is a view of a photo-excitation process apparatus with an internal light source.

With reference to FIG. 2, a light source 11 is attached inside the revolving gas chamber 1 by an appropriate means (not shown). A mirror 12 is attached by an appropriate means (not shown) between the light source 11 and the top face of the revolving gas chamber 1. In this embodiment there is no light transmitting window 3, and except for the exhaust outlet 10 provided at the lower part of a side wall of the gas reaction chamber 2, the arrangement is the same as that of FIG. 1.

Figure 3:
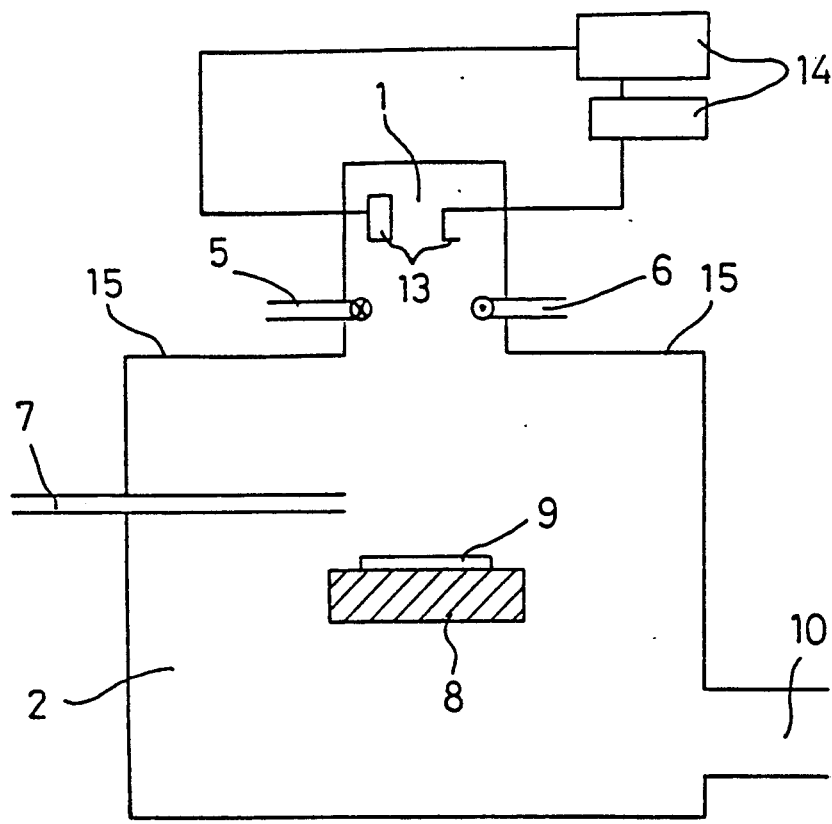
FIG. 3 is a view of a photo-excitation process (or plasma process) apparatus with internal discharge electrodes.

The arrangement shown in FIG. 3 is when the revolving gas chamber 1 is smaller than the gas reaction chamber 2 and discharge electrodes 13 are provided inside the revolving gas chamber 1. Numeral 14 denotes an external AC and DC power source. Numeral 15 denotes the top face of the gas reaction chamber 2 which is provided with a central opening having the cross-section as large as the revolving gas chamber 1. In this embodiment there is no light transmitting window 3 nor partition 4, and except for the exhaust outlet 10 provided at the lower part of a side wall of the gas reaction chamber 2, the arrangement is the same as that of FIG. 1.

Figure 4:
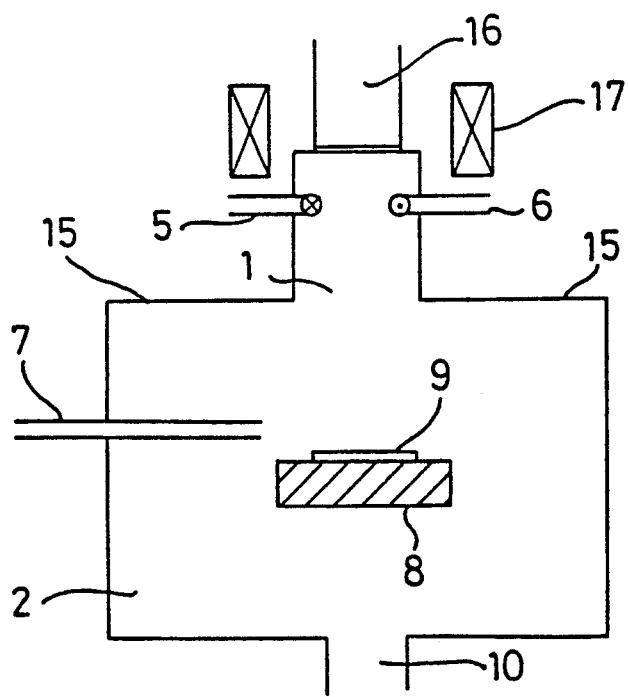
FIG. 4 is a view of a photo-excitation process (or plasma process) apparatus with an external microwave power source (or a radio-frequency power source)

The arrangement shown in FIG. 4 is when the revolving gas chamber 1 is smaller than the gas reaction chamber 2, and a microwave (or radio-frequency) guide 16 and a field coil 17 are provided outside the revolving gas chamber 1. Except for the absence of a light transmitting window 3 and a partition 4, the arrangement is the same as that of FIG. 1. The present invention is not limited to a photo-excitation process, but may also be employed with a conventional plasma process to produce the uniform gas flow on the substrate and to eliminate reverse flows to a plasma chamber.

Figure 5:
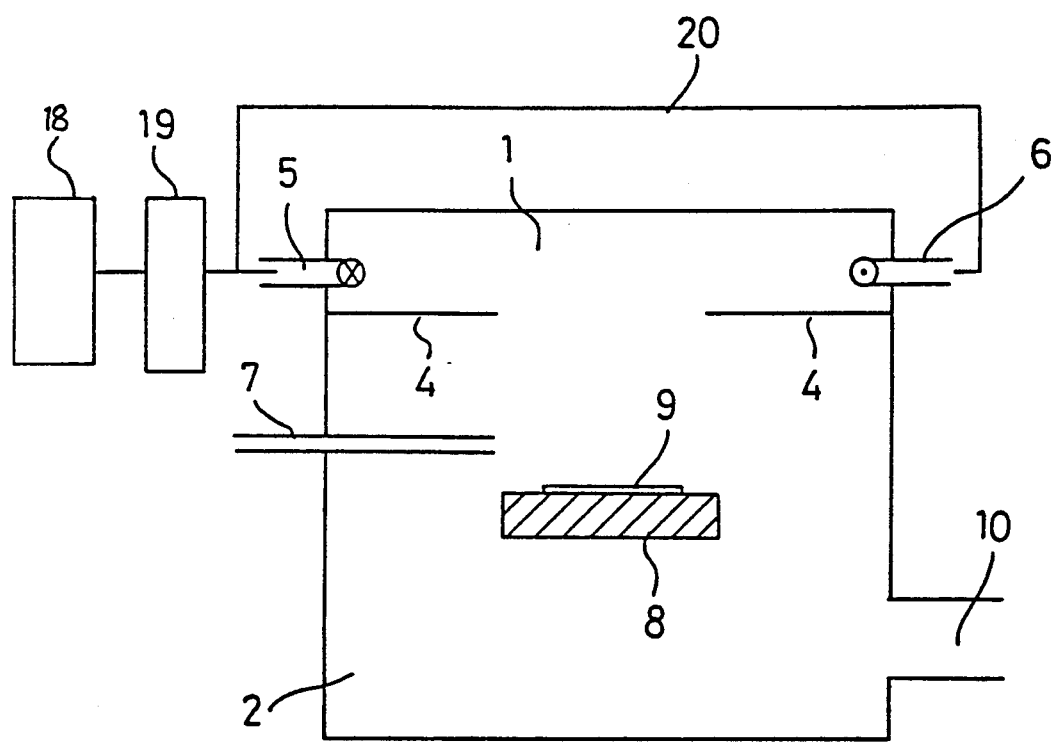
FIG. 5 is a view of an experimental apparatus in which the gas flow is made visible.
Figure 6:
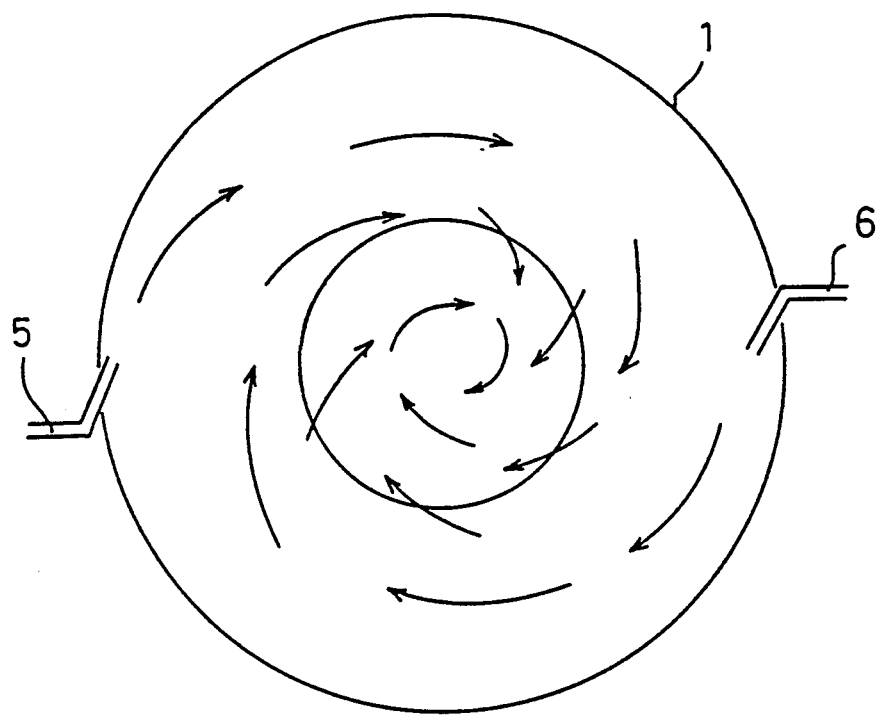
FIG. 6 is a plane view of the pattern produced by an experiment with the arrangement shown in FIG. 5.
Figure 7:
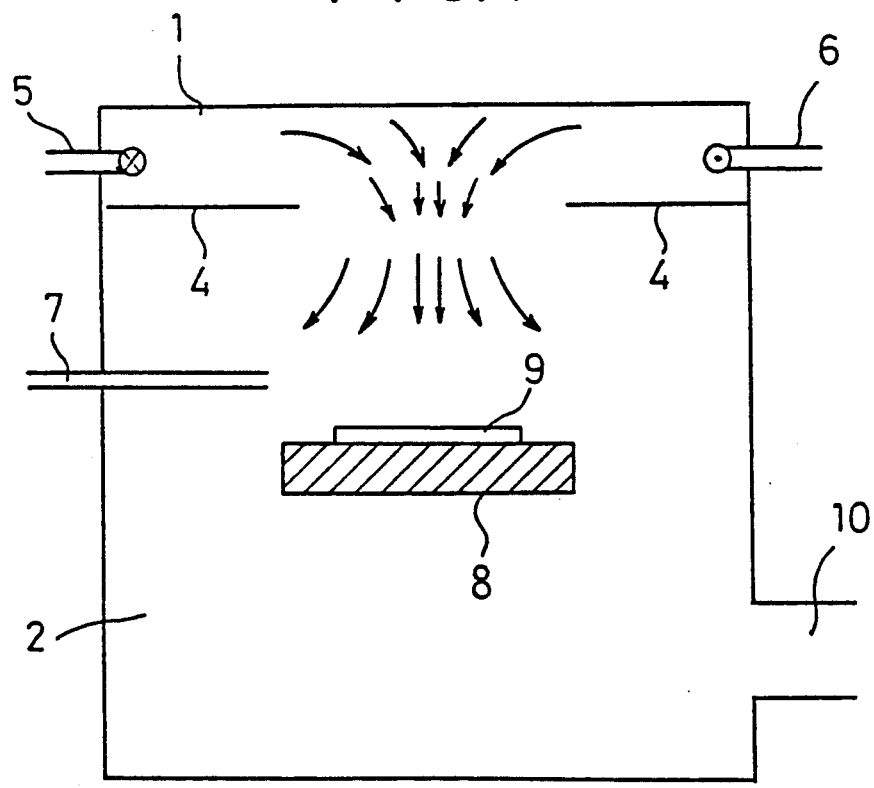
FIG. 7 is a side view of the pattern produced by an experiment with the arrangement shown in FIG. 5.
Figure 8:
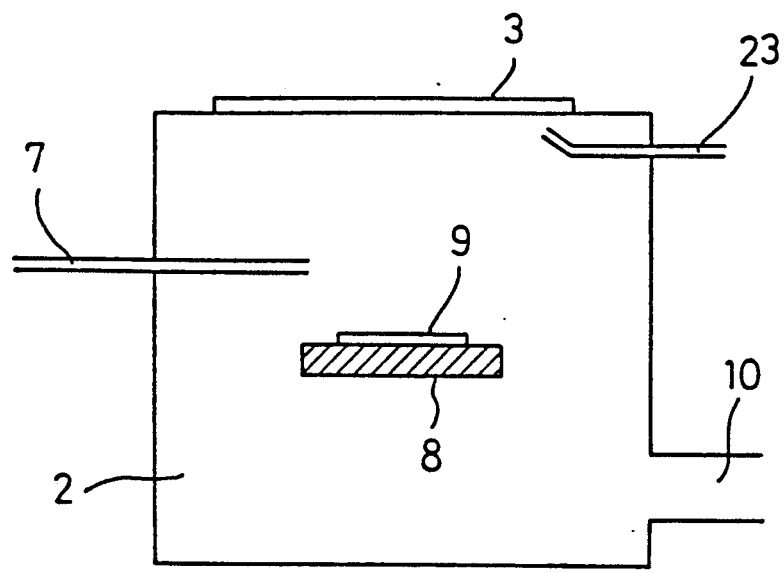
FIG. 8 is a view of a conventional apparatus with an external light source.
Figure 9:
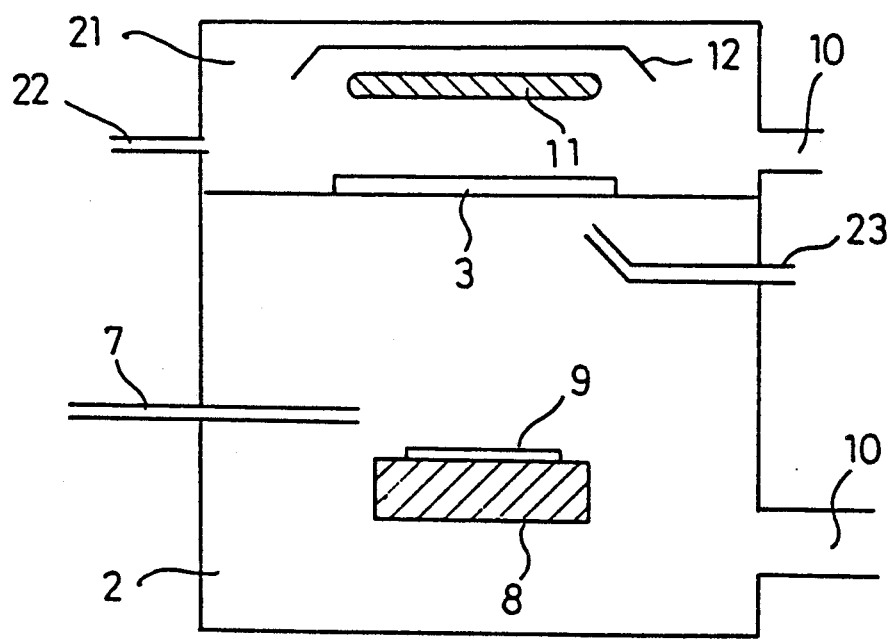
FIG. 9 is a view of a conventional apparatus with an internal light source.

In FIG. 5, a dry-ice mist generator 18 is connected to the gas inlet 5 by means of a drip trap 19, and is also connected to the gas inlet 6 by means of an external pipe 20. There is no light transmitting window 3, and except for the exhaust outlet 10 provided at the lower part of a side wall of the gas reaction chamber 2, the arrangement is the same as that of FIG. 1. The back pressure is $10^{-2}$ Torr. The revolving gas chamber 1 and gas reaction chamber 2 are constituted of transparent material to enable the interior to be viewed. The gas inlets are oriented at an angle of about 70° with respect to the center of the revolving gas chamber 1, to produce clockwise spiral vortices. In FIGS. 6 and 7, the arrows indicate rotating spiral vortices and the steady down flow without reverse flows, respectively.

The operation of this embodiment configured as described above will now be described. The embodiment shown in FIG. 1 has an external light source. Before starting the photochemical reaction, the revolving gas chamber 1 and gas reaction chamber 2 are purged of air. The purge carrier gas used is usually inert gas and carrier gas such as hydrogen, nitrogen, and oxygen.

After the revolving gas chamber 1 and gas reaction chamber 2 have been purged, the light source is used to emit light into the revolving gas chamber 1 via the light transmitting window 3 which shuts out the outside atmosphere. Any of the light sources described above may be used; in this embodiment a mercury lamp is used. Gas introduced into the revolving gas chamber 1 by the gas inlets 5 and 6 provided in the side wall of the revolving gas chamber 1 is formed into clockwise spiral vortices in the revolving gas chamber 1 by the orientation of the gas inlets 5 and 6 which are angled to produce clockwise spiral vortices flow of gas. The gas inlets 5 and 6 may also be oriented to produce a counterclockwise flow. The gas introduced via the gas inlets 5 and 6 may be any gas that does not give rise to a chemical reaction in the revolving gas chamber 1, such as for example inert gas, hydrogen, oxygen, nitrogen, carbon dioxide gas, rare gas, chloride gas, fluoride gas, nitride gas and halogen gas. In this embodiment, oxygen gas diluted with argon is used.

The spiral vortices formed in the revolving gas chamber 1 is narrowed down by the partition 4, and therefore flows into the gas reaction chamber 2 as it is, without disturbance of the vortex flow. The spiral vortices can be formed away from the window or top surface of the revolving as chamber, and the spiral vortices do not need to be in contact with the window or top surface of the revolving gas chamber. The reaction gas introduced via the reaction gas inlet 7 forms a gas layer above the substrate 9 with the revolving gas flow of spiral vortices to constitute an overall flow. This gas layer is excited by the light passing through the revolving gas chamber 1 and reaching the gas reaction chamber 2, producing a photochemical reaction on the substrate 9. The reaction gas is then drawn off through the exhaust outlet 10 by a vacuum pump and evacuated to the outside.

In this embodiment, the reaction gas used is $SiH_4$, which results in the formation of a layer of $SiO_2$ on the substrate 9. The substrate 9 is a silicon wafer. There are many possible types of reaction gas and substrate, any of which may be used. Because when $AsH_3$ or $PH_3$ or the like is used for the reaction gas a chemical reaction does not readily take place in the revolving gas chamber, the gas introduced into the gas inlet in the revolving gas chamber 1 can be made the same as the reaction gas. In this case, because the reaction gas already has been excited in the revolving gas chamber 1, it also has the effect of increasing the speed of the reaction in the gas reaction chamber 2.

The embodiment shown in FIG. 2, in which the light source is internal, operates in the same way as described above. As the spiral vortices revolves during its descent there is no turbulence, i.e., no reverse flow from gas reaction chamber 2, and the light source is not contaminated by the photochemical reaction. In addition, because in this case the light source is internal, an intense light can be obtained.

In the arrangement shown in FIG. 3, the revolving gas chamber is smaller than the gas reaction chamber. Because the revolving gas chamber is smaller, even when the gas is evacuated by a vacuum pump via the exhaust outlet 10, the gas formed into a spiral vortices in the revolving gas chamber 1 descends into the gas reaction chamber 2 without any disturbance of the vortex flow form. Because in this case the discharge is internal, an intense light can be obtained. As in this case, also, the spiral vortices revolves during its descent which prevent the reverse flow of reactants from gas reaction chamber 2, the discharge electrodes are not contaminated by the photochemical reaction.

This arrangement is also adapted to plasma process as it is. In the arrangement shown in FIG. 4, the discharge source for the light source is provided externally; except for the inclusion of a microwave (or radio-frequency) guide, the arrangement is the same as that illustrated in FIG. 3. Also, in the case of processes other than photo-excitation processes such as the plasma process, the revolving gas chamber 1 is not contaminated by the photochemical reaction (or plasma) because the spiral vortices revolves as it descends, which prevents the reverse flow due to the turbulent flow of reactants in the gas reaction chamber 2.

Although the embodiments illustrated in FIGS. 1 to 4 have been described as vertical types, the same effect may be obtained with a horizontal configuration where the spiral vortices flow moves either in a clockwise or counterclockwise fashion and in a direction perpendicular to the axis of the horizontal revolving gas chamber.

The result of the gas flow visualization experiment illustrated in FIG. 5 was that the dry-ice mist introduced into the revolving gas chamber 1 was observed to form spiral vortices and revolve in a regular fashion, when viewed from above, as in FIG. 6. The conditions were as follows. Pressure: 100 Torr; Reynolds number: 1120; dry-ice mist flow rate: about 400 cm$^3$/min. Regarding the flow of gas from the revolving gas chamber 1 to the gas reaction chamber 2 during the experiment, as shown in FIG. 7, the mist was observed to descend in an orderly fashion. Because with the method according to this invention the spiral vortices revolves during the descent, there is no back flow due to the turbulent flow of reactants in gas reaction chamber 2.

Thus, as has been described above, because the present invention provides spiral vortices, the process reaction on the substrate can be made highly uniform, enabling a photochemical reaction of stable quality to be carried out. The speed of the flow toward the substrate can also be made uniform. The spiral vortices produced in the revolving gas chamber descends into the gas reaction chamber 2 without undergoing any change, which has the effect of providing the same uniform chemical reaction on the substrate that would be provided by rotating the substrate holder. As such, it also eliminates the need to provide a means of rotating the substrate.

In addition, because the spiral vortices during the descent also prevents the light transmitting window from becoming contaminated as a result of the photochemical reaction, continuous operation for extended periods becomes possible. It also means that the area of the light transmitting window can be made larger compared with the conventional arrangements, and the increased amount of photon flux thereby transmitted by the window helps to raise the efficiency of the reaction. Similarly, when the light source is internal, as shown in FIG. 2, the photochemical reaction does not take place at the light source, so the light source does not become contaminated. Here, the spiral vortices can be formed away from the window or top surface of the revolving gas chamber, and do not need to be in contact with the window or top surface of the revolving gas chamber.

The inert or other gas for purging the window is in fact mixed with reactant gas and the complete isolation from the window is difficult in the teachings of the prior art involving blowing window means, whereas in the present case, complete isolation of the inert or other gas is realized by forming spiral vortices in the revolving gas chamber, which is not mixed with the reactant gas in said revolving gas chamber. Also, the simplicity of the method and construction required to provide the spiral vortices enable the apparatus to be fabricated at a low cost. Furthermore, because only the minimal amount of gas needed to obtain spiral vortices is required, less gas is used than in the conventional method in which a large amount of gas is used to prevent the light transmitting window from becoming contaminated. Because the reaction gas, carrier gas and doping gas can be prevented from mixing in the revolving gas chamber in this method, a one-chamber configuration can be used in place of the multi-chamber configurations of conventional apparatuses where contamination is a big problem.

I claim:

1. An apparatus for preventing window fouling and chamber wall fouling using gas spiral vortices in making semiconductors by a photo-excitation process or a plasma process which comprises:

(a) a revolving gas chamber for forming spiral vortices flow of purge gas and a gas reaction chamber, said revolving gas chamber being located above or beside said gas reaction chamber;
   (b) said revolving gas chamber having a multiplicity of gas inlets located in a wall thereof and which are oriented at an angle with respect to the center thereof and all of said gas inlets being oriented to produce a gas low therein in the same direction, control said gas flow therein to form said spiral vortices therein and prevent reverse flow due to turbulent flow of reactant gases in said gas reaction chamber and without mixing with reactant gases in said revolving gas chamber and with complete isolation from a window in said revolving gas chamber and from said reactant gases, and avoiding window fouling and chamber wall fouling in said revolving gas chamber, the spiral vortices being formed away from said window or top surface of said revolving gas chamber, and without the need to be in contact with said window or top surface of said revolving gas chamber;
   (c) said spiral vortices flow in said revolving gas chamber being in a clockwise or counter-clockwise direction and perpendicular to the axis thereof;
   (d) a partition having a centrally located circular opening disposed between said revolving gas chamber and said gas reaction chamber;
   (e) a light source disposed internally or externally with respect to said revolving gas chamber and providing light to said gas reaction chamber through said revolving gas chamber; and
   (f) one or a multiplicity of reactant gas inlets in said wall of said gas reaction chamber, an exhaust outlet connected to a vacuum pump located in a wall of said gas reaction chamber, and a substrate holder for supporting a substrate to be treated disposed in said gas reaction chamber between the gas inlets and the exhaust outlet.

2. An apparatus according to claim 1 wherein the light source is generated by plasma.

3. An apparatus according to claim 1 wherein the purge gas in the revolving gas chamber is selected from the group consisting of an inert gas, a rare gas, a carrier gas and nonreactive gas in said revolving gas chamber.

4. An apparatus for preventing window fouling and chamber wall fouling using gas spiral vortices in making semiconductors by a photo-excitation process or a plasma process, which comprises:

(a) a revolving gas chamber for forming spiral vortices flow of purge gas and a gas reaction chamber, said revolving gas chamber being located above or beside said gas reaction chamber without a partition therebetween and said revolving gas chamber being smaller than said gas reaction chamber;
   (b) said revolving gas chamber having a multiplicity of gas inlets located in a wall thereof and which are oriented at an angle with respect to the center thereof and all of said gas inlets being oriented to produce a gas flow therein in the same direction, control said gas flow therein, form said spiral vortices therein and prevent a reverse flow therein due to turbulent flow of reactant gases in said gas reaction chamber and without mixing with said reactant gases in said revolving gas chamber and with complete isolation from a light window in said revolving gas chamber and from said reactant gases, and avoiding window fouling and chamber wall fouling in said revolving gas chamber; said spiral vortices being formed away from said window or top surface of said revolving gas chamber, and without the need to be in contact with said window or top surface of said revolving gas chamber;

(c) said spiral vortices flow in said revolving gas chamber being in a clockwise or counter-clockwise direction and perpendicular to the axis thereof;

(d) a light source disposed internally or externally with respect to said revolving gas chamber and providing light to said gas reaction chamber through said revolving gas chamber; and (e) one or a multiplicity of reactant gas inlets in a wall of said gas reaction chamber, an exhaust outlet connected to a vacuum pump located in a wall of said gas reaction chamber, and a substrate holder for supporting a substrate to be treated disposed in said gas reaction chamber between the gas inlets and the exhaust outlet.

5. An apparatus according to claim 4 wherein the light source is generated by plasma.

6. An apparatus according to claim 4 wherein the purge gas in the revolving gas chamber is selected from the group consisting of an inert gas, a rare gas, a carrier gas and nonreactive gas in said revolving gas chamber.

* * * * *